(12) United States Patent
Wellner et al.

(10) Patent No.: US 10,704,909 B2
(45) Date of Patent: Jul. 7, 2020

(54) MEMS ROTATION RATE SENSOR INCLUDING COMBINED DRIVING AND DETECTION

(71) Applicant: Robert Bosch GmbH, Stuttgart (DE)

(72) Inventors: Patrick Wellner, Walddorfhaeslach (DE); Burkhard Kuhlmann, Reutlingen (DE); Mirko Hattass, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 151 days.

(21) Appl. No.: 15/742,756

(22) PCT Filed: May 24, 2016

(86) PCT No.: PCT/EP2016/061720
§ 371 (c)(1),
(2) Date: Jan. 8, 2018

(87) PCT Pub. No.: WO2017/012749
PCT Pub. Date: Jan. 26, 2017

(65) Prior Publication Data
US 2018/0209790 A1 Jul. 26, 2018

(30) Foreign Application Priority Data
Jul. 17, 2015 (DE) .................. 10 2015 213 450

(51) Int. Cl.
*G01C 19/5719* (2012.01)
*G01C 19/5733* (2012.01)

(52) U.S. Cl.
CPC ..... *G01C 19/5733* (2013.01); *G01C 19/5719* (2013.01); *B81B 2201/025* (2013.01)

(58) Field of Classification Search
CPC ........... G01C 19/5733; G01C 19/5719; G01C 19/56; G01C 19/5705; G01C 19/5755;
(Continued)

(56) References Cited

U.S. PATENT DOCUMENTS

| 6,250,156 B1 | 6/2001 | Seshia et al. |
| 7,051,590 B1 | 5/2006 | Lemkin et al. |

(Continued)

FOREIGN PATENT DOCUMENTS

| DE | 10350037 A1 | 5/2005 |
| DE | 102007030120 A1 | 1/2009 |
| WO | 2009050578 A2 | 4/2009 |

OTHER PUBLICATIONS

International Search Report dated Jul. 29, 2016, of the corresponding International Application PCT/EP2016/061720 filed May 24, 2016.

*Primary Examiner* — Robert R Raevis
(74) *Attorney, Agent, or Firm* — Norton Rose Fulbright US LLP; Gerard Messina

(57) ABSTRACT

A rotation rate sensor including a substrate having a principal plane of extension, and a structure movable with respect to the substrate; the structure being excitable from a neutral position into an oscillation having a movement component substantially parallel to a driving direction, which is substantially parallel to the principal plane of extension. To induce the oscillation, the rotation rate sensor includes a comb electrode moved along with the structure and a comb electrode fixed in position relative to the substrate. The excitation is produced by applying a voltage to the moving comb electrode and/or to the stationary comb electrode. Due to a rotation rate of the rotation rate sensor about an axis running substantially perpendicularly to the driving direction and substantially perpendicularly to the detection direction, a force applied to the structure with a force component along a detection direction substantially perpendicular to the driving direction is detectable.

7 Claims, 2 Drawing Sheets

(58) Field of Classification Search
CPC ............ G01C 19/5762; G01C 19/5642; B81B 2201/025
USPC .......................................... 73/504.12–504.16
See application file for complete search history.

(56) References Cited

U.S. PATENT DOCUMENTS

| | | | |
|---|---|---|---|
| 2004/0226369 A1* | 11/2004 | Kang | ................... B81B 3/0059 73/504.02 |
| 2006/0010978 A1* | 1/2006 | Lee | ................... G01C 19/5747 73/504.02 |
| 2006/0027019 A1* | 2/2006 | Ito | ...................... G01C 19/5719 73/504.12 |
| 2006/0055062 A1* | 3/2006 | Ohta | ................. G01C 19/5719 257/784 |
| 2014/0285976 A1 | 9/2014 | Kobayashi | |

* cited by examiner

MEMS ROTATION RATE SENSOR INCLUDING COMBINED DRIVING AND DETECTION

BACKGROUND INFORMATION

The present invention relates to a rotation rate sensor.

A rotation rate sensor is described, for example, in German Patent Application No. DE 10 2007 030 120 A1.

SUMMARY

A rotation rate sensor of the present invention may have the advantage that a rotation rate sensor on a substrate surface that is small relative to the related art is rendered possible, since a substrate surface that is small relative to the related art is only needed for the micromechanical structure of the rotation rate sensor, in order detect rotation rates.

This is achieved in that, in the case of the rotation rate sensor of an example embodiment of the present invention, the moving comb electrode and the stationary comb electrode are formed in such a manner, that, due to a rotation rate of the rotation rate sensor about an axis running substantially perpendicular to the driving direction and substantially perpendicular to the detection direction, a force acting upon the structure with a force component along a detection direction substantially perpendicular to the driving direction is detectable.

Through this, a rotation rate sensor having a substrate surface that is small relative to the related art is provided in a simple, mechanically robust and cost-effective manner. In particular, this allows the core surface of the rotation rate sensor to be reduced markedly. In addition, this therefore allows for the region of the driving structure, which is relatively large in area, to be integrated into the MEMS structure in such a manner, that no separate structural components are necessary for it. In particular, advantages over the related art are rendered possible, since the multiple use of the moving comb electrode and the stationary comb electrode both for driving and for detection of a force based on a Coriolis force as a measure of a rotation rate is provided. In this context, subdivision of the structure into Coriolis and detection frames is omitted, and the two frames or masses or structures are integrated into one structure. This integration reduces the surface of a rotation rate sensor by up to 20-40%, which results in a lowering of the manufacturing costs.

Advantageous embodiments and further refinements of the present invention are described herein with reference to the figures.

According to one preferred further refinement of the present invention, it is provided that the rotation rate sensor include at least one suspension device fixed to the substrate for movably suspending the structure relative to the substrate in such a manner, that the structure is deflectable with a movement component substantially parallel to the driving direction and/or with a movement component substantially parallel to the detection direction. This advantageously allows the structure to be movably suspended relative to the substrate in such a manner, that the oscillatory characteristic of the rotation rate sensor of the present invention is rendered possible.

According to one preferred further refinement of the present invention, the suspension device includes at least one spring deformable substantially in the driving direction and/or substantially in the detection direction. In this manner, a simple, mechanically robust, and cost-effective suspension device is advantageously provided.

One preferred further refinement provides for the moving comb electrode to include at least one first electrode, the stationary comb electrode including at least one second electrode and at least one third electrode. This advantageously renders a capacitive drive and/or capacitive rotation rate detection possible. In addition, it is therefore possible for the comb electrodes to include electrode fingers. Furthermore, multiple use of capacitive electrode fingers for both the driving of the structure and the detection of a Coriolis force acting upon the structure and/or of a Coriolis deflection of the structure as a measure of a rotation rate applied to the rotation rate sensor is therefore rendered possible.

According to one preferred embodiment, it is provided that a first potential be applicable to the moving comb electrode and/or a second potential be applicable to the stationary comb electrode, in such a manner, that the structure may be induced to oscillate from the neutral position with the aid of the first potential and/or with the aid of the second potential. In this manner, the effect of stray fields may be advantageously used for inducing the oscillation.

According to a preferred further refinement, a first change in capacitance between the first electrode and the second electrode and/or a second change in capacitance between the first electrode and the third electrode are measurable in such a manner, that the force applied to the structure is detectable with the aid of the first change in capacitance and/or with the aid of the second change in capacitance. Therefore, multiple use of the moving comb electrode and the stationary comb electrode for both exciting the structure and detecting a Coriolis force acting upon the structure as a measure of a rotation rate applied to the rotation rate sensor becomes possible.

One preferred further refinement provides for the structure to include at least one first substructure movable with respect to the substrate and at least one second substructure movable with respect to the substrate and with respect to the first substructure; the first substructure and the second substructure being excitable from respective neutral positions into an oscillation, which is substantially 180 degrees out of phase and has movement components substantially parallel to the driving direction; in order to induce the oscillation 180 degrees out of phase, the rotation rate sensor including at least one comb electrode moved along with the first substructure and at least one comb electrode moved along with the second substructure for respective interaction with the stationary comb electrode; the inducement of the oscillation 180 degrees out of phase being able to be effected by applying voltage to the comb electrode moved along with the first substructure, and to the comb electrode moved along with the second substructure, and/or to the stationary electrode; the comb electrode moved along with the first substructure and the comb electrode moved along with the second substructure and the stationary comb electrode being formed in such a manner, that, due to the rotation rate, a first additional force applied to the first substructure and a second additional force applied to the second substructure, which have force components essentially 180 degrees out of phase and substantially parallel to the detection direction, are detectable. Therefore, a rotation rate sensor, which is robust with respect to parasitic linear accelerations, is advantageously rendered possible, in a simple, mechanically robust and cost-effective manner, on a substrate surface that is small relative to the related art.

According to a preferred further refinement, it is provided that the rotation rate sensor include a coupling structure for coupling the first substructure to the second substructure in such a manner, that the first substructure and the second substructure may be induced to oscillate 180 degrees out of phase, and/or that the action of the first force and the action of the second force are detectable. Consequently, the robustness with respect to parasitic linear accelerations is advantageously increased. It is preferable for the coupling structure to allow that the first substructure and the second substructure be displaceable into oscillation 180 degrees out of phase, and/or that the first substructure and the second substructure be displaceable into a further oscillation 180 degrees out of phase, which is directed substantially along the action of the first force and along the action of the second force, respectively.

According to a preferred further refinement, the coupling structure includes at least one further spring deformable substantially in the detection direction. Therefore, in a simple, mechanically robust, and cost-effective manner, it is ensured that the first substructure and the second substructure are deflectable into the further oscillation 180 degrees out of phase.

DETAILED DESCRIPTION OF EXAMPLE EMBODIMENTS

In the various figures, identical parts are denoted by the same reference symbols and are therefore named or mentioned only once.

Figure 1:
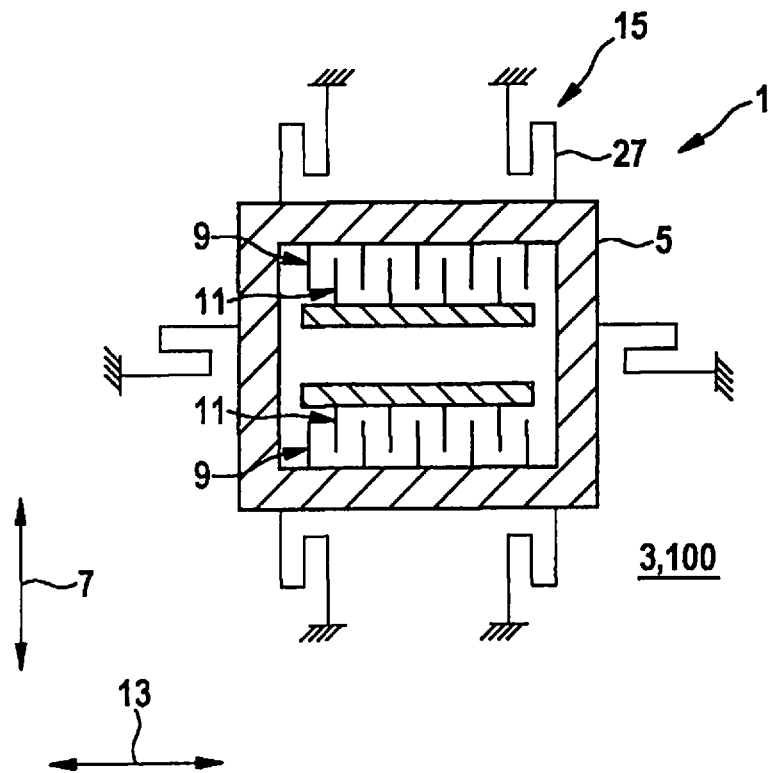
FIG. 1 shows a schematic view of a rotation rate sensor according to a first exemplary embodiment of the present invention.

A schematic view of a rotation rate sensor 1 according to a first exemplary embodiment of the present invention is shown in FIG. 1, rotation rate sensor 1 including a substrate 3 having a principal plane of extension 100 and a structure 5 moveable with respect to substrate 3. In this connection, structure 5 may be excited from a neutral position of structure 5 shown in FIG. 1, into an oscillation having a movement component substantially parallel to a driving direction 7. In order to induce the oscillation, rotation rate sensor 1 includes, for example, two comb electrodes 9 moved along with structure 5 and, for example, two comb electrodes 11 fixed in position relative to substrate 3. In this case, the excitation may be effected by applying voltage to moving comb electrodes 9 and/or to stationary comb electrodes 11. In addition, moving comb electrodes 9 and stationary comb electrodes 11 are formed in such a manner, that due to a rotation rate of rotation rate sensor 1 about an axis running substantially perpendicular to driving direction 7 and substantially perpendicular to detection direction 13, a force, which acts upon structure 5 and includes a force component along a detection direction 13, is detectable. Moving comb electrodes 9 and stationary comb electrodes 11 preferably include comb fingers, which are electrically controllable in pairs, using a potential. Moving comb electrodes 9 and stationary comb electrodes 11 are preferably used for both driving and detection.

This therefore provides a possible specific embodiment for a combined Coriolis and detection frame, and the multiple use of the electrodes. Comb fingers are attached to the combined Coriolis and detection frame, the comb fingers having their counterpart in stationary fingers, which are fixed to the substrate and may be controlled electrically in pairs, using a potential. These electrodes are used for both driving and detection.

In FIG. 1, it is also shown that rotation rate sensor 1 includes, for example, six suspension devices 15 fixed to the substrate, for movably suspending structure 5 relative to substrate 3. Through this, structure 5 is deflectable so as to have a movement component substantially parallel to driving direction 7 and/or a movement component substantially parallel to detection direction 13. Each of the six suspension devices 15 includes a spring 27 deformable substantially in driving direction 7 and/or substantially in detection direction 13.

For example, the different regions, in particular, the Coriolis and detection frames, of a rotation rate sensor are coupled mechanically by springs, which are flexible in one direction and relatively rigid in the other, as a function of the type of spring. For example, spring types A and B are flexible in the driving direction and highly rigid in the detection direction. An exemplary spring type C is highly rigid in the driving direction and flexible in the detection direction. This subdividing does have the advantage of separating driving and detection already in the mechanics, but requires the corresponding area. Typically, the pure drive train, including the typical comb fingers, takes up approximately ¼ of the core surface of a rotation rate sensor.

By way of example, springs 27 are of a spring type D, which differs from the spring types A-C in that the spring of spring type D is deformable in 2 directions, that is, in the driving direction and detection direction.

Figure 2:
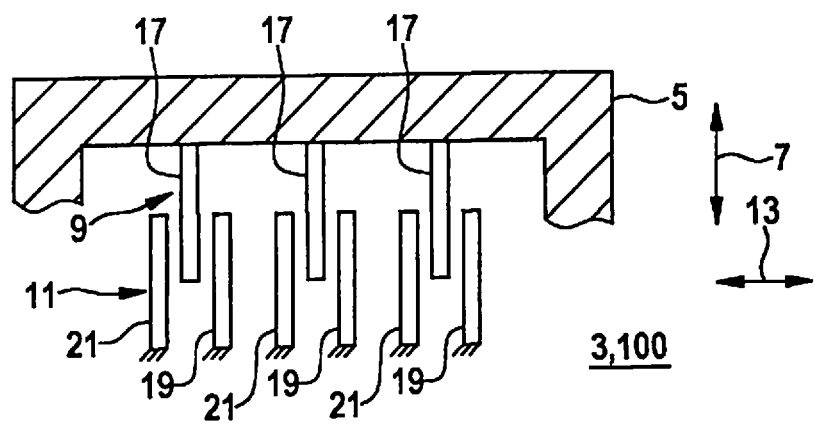
FIG. 2 shows a schematic view of an enlarged subsection of a rotation rate sensor according to a second exemplary embodiment of the present invention.

A schematic view of an enlarged subsection of a rotation rate sensor 1 according to a second exemplary embodiment of the present invention is represented in FIG. 2. By way of example, FIG. 2 shows that moving comb electrode 9 includes three first electrodes 17, and that stationary comb electrode 11 includes three second electrodes 19 and three third electrodes 21. In this connection, a first potential may be applied to moving comb electrode 9, that is, the three first electrodes 17, and/or a second potential may be applied to stationary comb electrode 11, that is, the three second electrodes 19, and to the three third electrodes 21, in such a manner, that structure 5 may be induced to oscillate from the neutral position with the aid of the first potential and/or with the aid of the second potential. In the case of the driving in a direction, a constant DC voltage is applied between second electrodes 19 and third electrodes 21, thus, for example, between fixed electrodes C1 and C2 and the three first electrodes 17, thus, for example, the plunging electrodes CM at the movable structure. In this context, the second potential at second electrode 19, thus, for example, C1, and the second potential at third electrode 21, thus, for example, C2, are connected to the same DC potential, which differs from the first potential, thus, for example, CM. Due to the stray fields in front of the plunging electrode, the sensor, that is, structure 5, is deflected parallelly to the electrode direction. Preferably, it is also provided that moving comb electrode 9 include second electrodes 19 and third electrodes 21, and that stationary comb electrode 11 include first electrodes 17.

In addition, a first change in capacitance between adjacent first electrodes 17 and second electrodes 19 and/or a second change in capacitance between adjacent first electrodes 17 and third electrodes 21 are measurable in such a manner, that the force applied to structure 5 is detectable with the aid of the first change in capacitance and/or with the aid of the second change in capacitance. Therefore, during the driving, besides the applied DC voltage, a change in capacitance between electrodes CM↔C1 and CM↔C2 is measured. Through this, it is possible, during the driving, to use first electrodes 17, second electrodes 19 and third electrodes 21 for the detection, as well, thus, for example, for a deflection perpendicular to the electrode direction. Apart from the applied DC voltage, the measuring of the first change in capacitance and of the second change in capacitance during the driving is rendered possible, for example, using a temporally very brief superposition with respect to the applied DC signal or a multiplexing. In multiplexing, the voltage for driving is temporarily removed, in order to measure the changes in capacitance in detection direction 13, between the electrodes.

Figure 3:
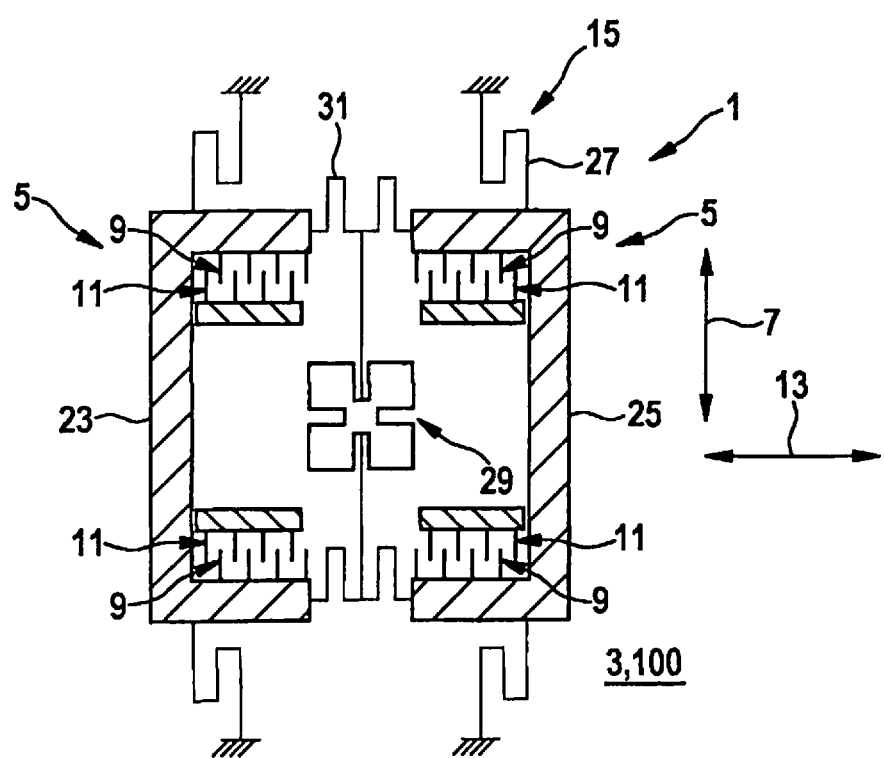
FIG. 3 shows a schematic view of a rotation rate sensor according to a third exemplary embodiment of the present invention.

A schematic view of a rotation rate sensor 1 according to a third exemplary embodiment of the present invention is shown in FIG. 3. In the exemplary embodiment represented in FIG. 3, structure 5 includes a first substructure 23 movable with respect to substrate 3 and a second substructure 25 movable with respect to substrate 3 and with respect to first substructure 23. In this connection, first substructure 23 and second substructure 25 may be excited from respective neutral positions into an oscillation, which is essentially 180 degrees out of phase and includes movement components substantially parallel to driving direction 7. In addition, in order to induce the oscillation that is 180 degrees out of phase, the exemplary embodiment represented in FIG. 3 includes two comb electrodes 9 moved along with first substructure 23 and two comb electrodes 9 moved along with second substructure 25 for respective interaction with the four stationary comb electrodes 11 illustratively represented in FIG. 3. Furthermore, the inducement of the oscillation 180 degrees out of phase may be effected by applying voltage to the two comb electrodes 9 moved along with first substructure 23 and to the two comb electrodes 9 moved along with second substructure 25 and/or to the four stationary comb electrodes 11. In this connection, the two comb electrodes 9 moved along with first substructure 23 and the two comb electrodes 9 moved along with second substructure 25 and the four stationary comb electrodes 11 are formed in such a manner, that due to the yaw rate, a first additional force applied to first substructure 23 and a second additional force applied to second substructure 25, which have force components substantially parallel to detection direction 23 that are essentially 180 degrees out of phase, are detectable.

By way of example, FIG. 3 further shows that the rotation rate sensor 1 represented in FIG. 3 includes a coupling structure 29 for mechanically coupling first substructure 23 to second substructure 25 in such a manner, that first substructure 23 and second substructure 25 may be induced to oscillate 180 degrees out of phase and/or that the action of the first force and the action of the second force are detectable. In this connection, coupling structure 29 includes, by way of example, four additional springs 31 deformable substantially in detection direction 13. It is preferably provided that, in response to an applied rotation rate, first substructure 23 and second substructure 25 be deflectable into a further oscillation, which is substantially 180 degree out of phase and is essentially along detection direction 13. In this case, coupling structure 29 ensures that the two movements 180 degrees out of phase are possible during both the driving and detection.

The mechanically coupled and substantially specularly symmetric substructures 23, 25, i.e., coupled partial oscillators, which are represented in FIG. 3 by way of example and are driven antisymmetrically, allow the movement of the detection structure, which is due to a Coriolis force as a reaction to a rotation rate, to be distinguished from a parasitic linear acceleration at the driving frequency (e.g., vibrations in the vehicle). In this connection, the partial oscillators are formed specularly symmetrically, for example, and coupled mechanically by a coupling spring cross. For example, in response to an applied rotation rate in the z-direction, the two subsections are deflected antisymmetrically, as well. In this context, the coupling spring cross ensures that the two antisymmetric movements, drive and detection, are possible. For example, the suspension mounts are implemented, using spring type D. The comb fingers for driving and Coriolis detection are formed comparably to the exemplary embodiment in FIG. 2.

The moving comb electrode 9 and stationary comb electrode 11 depicted in FIG. 2 are preferably provided for both the exemplary embodiment in FIG. 1 and the exemplary embodiment in FIG. 3.

By way of example, the exemplary embodiments represented here describe omega-z rotation rate sensors, which allow a considerable reduction in the core surface. However, the use of the features represented here is also intended for other rotation rate sensors.

What is claimed is:

1. A rotation rate sensor, comprising:
   a substrate;
   at least one structure movable with respect to the substrate, the structure being excitable from a neutral position of the structure, into an oscillation having a movement component substantially parallel to a driving direction to induce the oscillation, the rotation rate sensor including at least one moving comb electrode moved along with the structure and at least one stationary comb electrode fixed in position relative to the substrate, the excitation being able to be effected by applying voltage to at least one of the moving comb electrode, and the stationary comb electrode, wherein the moving comb electrode and the stationary comb electrode are formed in such a manner that, due to a rotation rate of the rotation rate sensor about an axis running substantially perpendicularly to the driving direction and substantially perpendicularly to a detection direction, a force, which is applied to the structure and includes a force component along a detection direction substantially perpendicular to the driving direction, is detectable, wherein the moving comb electrode includes at least one first electrode, the stationary comb electrode including at least one second electrode and at least one third electrode; and
   at least one of: (i) a first change in capacitance between the first electrode and the second electrode, and (ii) a second change in capacitance between the first electrode and the third electrode are measurable in such a manner, that the force applied to the structure is detectable with the aid of at least one of the first change in capacitance and the second change in capacitance.

2. The rotation rate sensor as recited in claim 1, wherein the rotation rate sensor includes at least one suspension device fixed to the substrate for movably suspending the structure relative to the substrate in such a manner, that the structure is deflectable with at least one of: (i) a movement component substantially parallel to the driving direction, and (ii) a movement component substantially parallel to the detection direction.

3. The rotation rate sensor as recited in claim 2, wherein the at least one suspension device includes at least one spring deformable at least one of: (i) substantially in the driving direction, and (ii) substantially in the detection direction.

4. The rotation rate sensor as recited in claim 1, wherein at least one of: (i) a first potential may be applied to the moving comb electrode, and (ii) a second potential may be applied to the stationary comb electrode, in such a manner, that, with the aid of at least one of the first potential and the second potential, the structure may be excited from the neutral position into the oscillation.

5. The rotation rate sensor as recited in claim 1, wherein the structure includes at least one first substructure movable with respect to the substrate and at least one second substructure movable with respect to the substrate and with respect to the first substructure, the first substructure and the second substructure being excitable from respective neutral positions into an oscillation, which is substantially 180 degrees out of phase and has movement components substantially parallel to the driving direction, and wherein to induce the oscillation 180 degrees out of phase, the rotation rate sensor includes at least one comb electrode moved along with the first substructure and at least one comb electrode moved along with the second substructure for respective interaction with the stationary comb electrode, the inducement of the oscillation 180 degrees out of phase being able to be effected by applying voltage to at least one of: (i) the comb electrode moved along with the first substructure, and to the comb electrode moved along with the second substructure, and (ii) the stationary comb electrode, the comb electrode moved along with the first substructure and the comb electrode moved along with the second substructure and the stationary comb electrode being formed in such a manner, that, due to the rotation rate, a first additional force applied to the first substructure and a second additional force applied to the second substructure, which have force components substantially parallel to the detection direction that are substantially 180 degrees out of phase, are detectable.

6. The rotation rate sensor as recited in claim 5, wherein the rotation rate sensor includes a coupling structure for coupling the first substructure to the second substructure in such a manner, that at least one of: (i) the first substructure and the second substructure may be induced to oscillate 180 degrees out of phase, and (ii) the action of the first force and the action of the second force are detectable.

7. The rotation rate sensor as recited in claim 6, wherein the coupling structure includes at least one additional spring deformable substantially in the detection direction.

* * * * *